(12) United States Patent
Oya

(10) Patent No.: US 6,307,770 B1
(45) Date of Patent: Oct. 23, 2001

(54) NONVOLATILE SEMICONDUCTOR MEMORY DEVICE AND A METHOD OF FABRICATING THE SAME

(75) Inventor: Yukihiro Oya, Osaka (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 09/651,337

(22) Filed: Aug. 31, 2000

Related U.S. Application Data

(62) Division of application No. 09/237,336, filed on Jan. 26, 1999, now Pat. No. 6,111,184.
(60) Provisional application No. 60/073,094, filed on Jan. 30, 1998.

(30) Foreign Application Priority Data

Mar. 17, 1998 (JP) .................................................. 10-67343
Jan. 11, 1999 (JP) .................................................. 11-4358

(51) Int. Cl.$^7$ ........................................................ G11C 5/06
(52) U.S. Cl. ........................ 365/63; 365/185.01; 257/315
(58) Field of Search ............................... 335/63, 185.01, 335/185.1; 257/314, 315, 316

(56) References Cited

U.S. PATENT DOCUMENTS

| | | | |
|---|---|---|---|
| 5,045,488 | 9/1991 | Yeh | 437/43 |
| 5,753,962 | 5/1998 | Jeng | 257/510 |
| 5,780,892 | 7/1998 | Chen | 257/317 |
| 5,940,706 | 8/1999 | Sung et al. | 438/261 |
| 5,972,753 | * 10/1999 | Lin et al. | 438/265 |
| 6,108,242 | * 8/2000 | Lin et al. | 365/185.33 |
| 6,121,088 | * 9/2000 | Lin et al. | 438/264 |
| 6,133,097 | * 10/2000 | Hsieh et al. | 438/266 |

* cited by examiner

*Primary Examiner*—Richard Elms
*Assistant Examiner*—Hien Nguyen
(74) *Attorney, Agent, or Firm*—Armstrong, Westerman, Hattori, McLeland & Naughton, LLP

(57) ABSTRACT

A nonvolatile semiconductor memory device of the present invention comprises: an isolation film formed on a semiconductor substrate of one conductivity type; a floating gate which is formed in an active region isolated by said isolation film so as to be disposed in a gap between adjacent isolation films and make each of end portions coincident with each end of said isolation film in a self-aligned manner; a tunnel oxide film which covers said floating gate; a control gate formed on said tunnel oxide film so as to comprise a region which overlaps said floating gate; a diffusion region of an opposite conductivity type and formed in a surface of the semiconductor substrate adjacent to said floating gate and the control gate.

9 Claims, 17 Drawing Sheets

NONVOLATILE SEMICONDUCTOR MEMORY DEVICE AND A METHOD OF FABRICATING THE SAME

This application is a Divisional of Ser. No. 09/237,336 filed Jan. 26, 1999 now U.S. Pat. No. 6,111,184; which claims benefits to Provisonal Application 60/073,094 filed Jan. 30, 1998.

BACKGROUND OF THE INVENTION

1. Field of the Invention

The present invention relates to a nonvolatile semiconductor memory device comprising an isolation film formed on a silicon substrate, a floating gate which is formed in an active region isolated by the isolation film and disposed a in gap between adjacent isolation film(s), and a control gate having a region which overlaps one end portion of the floating gate via a tunnel oxide film covering the floating gate, and also to a method of fabricating such a device.

2. Description of the Related Art

In a nonvolatile semiconductor memory device in which each memory cell consists of a single transistor and can be electrically erased, particularly in a programmable ROM (EEPROM: Electrically Erasable and Programmable ROM), each memory cell is formed by a transistor of a double gate structure having a floating gate and a control gate. In such a transistor of a double gate structure, a data is written by injecting hot electrons generated in the channel under the gap region formed by the floating gate and the control gate into the floating gate. The data is erased by extracting charges from the floating gate to the control gate by means of F-N tunneling (Fowler-Nordheim tunneling).

FIG. 10 is a plan view of a memory cell of a nonvolatile semiconductor memory device having a floating gate, and FIG. 11 is a cross sectional view taken along the line X2—X2. These figures show a split gate structure in which a control gate 6 is juxtaposed with a floating gate 4.

In a surface region of a P-type silicon substrate 1, plural isolation films 2 consisting of a LOCOS oxide film which is formed with being selectively thickened by the LOCOS (Local Oxidation Of Silicon) process are formed in a strip-like manner so as to partition the surface region into device regions. Floating gates 4 are arranged on the silicon substrate 1 via an oxide film 3A so as to extend over adjacent isolation films 2. Each of the floating gates 4 is independently formed for each memory cell. A selective oxide film 5 on the floating gate 4 is formed by the selective oxidizing method so as to be thick in a center portion of the floating gate 4, and causes an edge portion of the floating gate 4 to have an acute angle. According to this configuration, during the data erasing operation, the electric field is easily enhanced in the end portion of the floating gate 4.

On the silicon substrate 1 where the plural floating gates 4 are arranged, control gates 6 are arranged via a tunnel oxide film 3 integrated with the oxide film 3A, so as to respectively correspond to the rows of the floating gates 4. Each of the control gates 6 is disposed so that a part of the control gate overlaps the floating gate 4 and the other part is contacted with the silicon substrate 1 via the oxide film 3A. The floating gates 4 and the control gates 6 are arranged so that adjacent rows are symmetrical with respect to plane (i.e., symmetrical with respect to one sectional plane).

N-type drain regions 7 and source regions 8 are formed in substrate regions between adjacent control gates 6 and those between adjacent floating gates 4. Each drain region 7 is independently formed so as to be surrounded by the isolation films 2 between the control gates 6, to each source region 8 is continuous in the direction along with the control gates 6. A memory cell transistor is configured by the floating gate 4, the control gate 6, the drain region 7, and the source region 8.

An aluminum interconnection 10 is disposed over the control gate 6 and floating gate 4 via an oxide film 9 with the angle of 90 degrees to the control gate. The aluminum interconnection 10 is connected to the drain region 7 via a contact hole 11. Each control gate 6 functions as a word line, the source region 8 extending in parallel with the control gate 6 functions as a source line, and the aluminum interconnection 10 connected to the drain region 7 functions as a bit line.

In the memory cell transistor of the double gate structure, the conductance between the source and the drain is varied depending on the amount of charges injected to the floating gate 4. Therefore, charges are selectively injected to the floating gates 4, so that the channel conductance of specific memory cell transistors are varied.

The differences of the operation characteristics of the memory cell transistors caused by the variation are made corresponding to stored data.

In the nonvolatile semiconductor memory device, for example, the operations of writing, erasing, and reading a data are achieved in the following manner. In the writing operation, the potential of the control gate 6 is set to 2 V, that of the drain region 7 is set to 0.5 V, and the high potential of the source region 8 is set to 12 V. As a result, when the high potential is applied to the source region 8, the potential of the floating gate 4 is raised to about 9 V in accordance with the coupling ratio between the source region 8 and the floating gate 4, and hot electrons generated in the vicinity of the channel are accelerated toward the floating gate 4 and then injected to the floating gate 4 via the oxide film 3A, thereby writing a data.

Contrary that, in the erasing operation, the potentials of the drain region 7 and the source region 8 are set to 0 V, and the control gate 6 is set to 14 V. As a result, charges (electrons) accumulated in the floating gate 4 are discharged by means of F-N tunneling from the acute angle portion of the edge portion of the floating gate 4 to the control gate 6 with passing through the tunnel oxide film 3, thereby erasing the data.

In the reading operation, the potential of the control gate 6 is set to 4 V, the drain region 7 is set to 2 V, and the source region 8 is set to 0 V. In this case, when injected charges (electrons) exist in the floating gate 4, the potential of the floating gate 4 is lowered, and hence no channel is formed below the floating gate 4 so that the drain current does not flow. By contrast, when injected charges (electrons) do not exist in the floating gate 4, the potential of the floating gate 4 is raised, and hence a channel is formed below the floating gate 4 so that the drain current flows.

Hereinafter, a method of fabricating the nonvolatile semiconductor memory device will be described. In FIGS. 12 to 17, A is a top view, B is a cross sectional view taken along the line A—A of A, and C is a cross sectional view taken along the line B—B of A.

Referring to FIG. 12, the isolation film 2 is formed on the silicon substrate 1 by the LOCOS process. Namely, as shown in FIG. 12B, a pad oxide film 21 and a pad polycrystalline silicon film 22 are formed on the silicon substrate 1. Thereafter, selective oxidation is conducted with using a silicon nitride film 23 having an opening as a mask, thereby forming the isolation film 2.

Next, as shown in FIG. 13, the pad oxide film 21 and the pad polycrystalline silicon film 22 in the device forming region are removed away. As shown in FIG. 14, thereafter, the upper portion of the silicon substrate 1 is thermally oxidized to form the oxide film 3A, a polycrystalline silicon film 24 is formed on the oxide film, and a silicon nitride film 25 having an opening is then formed.

As shown in FIG. 15, the polycrystalline silicon film 24 is selectively oxidized with using the silicon nitride film 25 as a mask, thereby forming the selective oxide film 5.

Thereafter, as shown in FIG. 16, the silicon nitride film 25 is removed away, and the polycrystalline silicon film 24 is then etched with using the selective oxide film 5 as a mask, thereby forming the floating gate 4.

As shown in FIG. 17, the tunnel oxide film 3 is formed (on the entire face), a conductive film consisting of a polycrystalline silicon film and a tungsten silicide film is then formed, and the conductive film is patterned to form the control gate 6. Alternatively, the control gate 6 may be a single-layer film consisting of a polycrystalline silicon film.

Although the description is omitted, as shown in FIGS. 10 and 11, the source region 8 and the drain region 7 are then formed so as to form a memory cell of the nonvolatile semiconductor memory device.

However, such a nonvolatile semiconductor memory device has the following problem. As shown in FIG. 18 (which is an enlarged view of a part of FIG. 17B), the control gate 6 covering the floating gate 4 which overrides an end portion of the isolation film 2 is sharpened in a horn-like manner (see A in the circle of a broken line shown in FIG. 18), and the electric field is concentrated in the portion. Therefore, the dielectric strength between the floating gate 4 and the control gate 6 is lowered, so that a so-called reverse tunneling failure easily occurs.

The memory device has a further problem in that a high accuracy is required in alignment of the floating gate 4 and the isolation film 2. When mask misalignment once occurs between the mask for forming the isolation film and that for forming the floating gate, an end portion of the floating gate 4 cannot overlap the isolation film 2, or the degree of overlap is small (see FIG. 19).

In such a case that in an end portion of the floating gate 4 cannot overlap the isolation film 2, or the degree of overlap is small in a region, even if in the reading operation, the floating gate is in a written state (in which electron is accumulated) and drain current properly does not flow in the channel region, for example, a leak current flows from the source region 8 toward the drain region 7 as shown in FIG. 19 (see the arrow $I_L$ in the figure). As a result, there arises a problem in that it is judged that the memory cell is in the erased state.

When, in order to cope with the problem, the size of the floating gate is increased, there arises a problem in that adjacent floating gates are contacted with each other because the gap between adjacent floating gates is very narrow as shown in FIG. 10.

SUMMARY OF THE INVENTION

It is an object of the invention to provide a nonvolatile semiconductor memory device in which generation of a leak current due to mask misalignment between a mask for forming an isolation film and that for forming a floating gate is suppressed and also generation of a reverse tunneling failure is suppressed, and a method of fabricating such a device.

The invention has been conducted in order to solve the above-discussed problems. The nonvolatile semiconductor memory device of the invention comprises: an isolation film formed on a semiconductor substrate of one conductivity type; a floating gate which is formed in an active region isolated by the isolation film so as to be disposed in a gap between adjacent isolation films and make each of end portions coincident with each of said adjacent isolation films in a self-aligned manner; a tunnel oxide film which covers the floating gate; a control gate formed on the tunnel oxide film, which overlaps part of or all of the floating gate; and a diffusion region of an opposite conductivity type and formed in a surface of the silicon substrate adjacent to the floating gate and the control gate.

In the method of fabricating the device, a gate oxide film and a polycrystalline silicon film are formed on a silicon substrate of one conductivity type, a silicon nitride film having a first opening is formed on the polycrystalline silicon film, and an isolation film is then formed by selectively oxidizing the polycrystalline silicon film by a LOCOS process with using the silicon nitride film as a mask. Thereafter, a floating gate is formed by patterning so as to define an end portion of said first film which is not oxidized by said selective oxidation and remains in a gap between adjacent isolation films, said end portion being on a side which perpendicularly intersects with an interface with said isolation film.

The nonvolatile semiconductor memory device of the invention comprises: an isolation film 2 formed on a semiconductor substrate 1 of one conductivity type; a floating gate 34 which is formed in an active region other than the isolation film 2 and disposed in a gap between adjacent isolation films 2, the floating gate having a sharp edge portion in an upper portion; a tunnel oxide film 33 which covers the floating gate 34; a control gate 36 which is formed on the tunnel oxide film 33 so as to overlap part of or all of the floating gate 34; and a drain region 37 and a source region 38 of an opposite conductivity type and formed in a surface of the silicon substrate 1 adjacent to the floating gate 34 and the control gate 36.

In the method of fabricating the device, a gate oxide film 31 and a polycrystalline silicon film 32 are formed on the silicon substrate 1, a silicon nitride film 23 having a first opening is formed on the polycrystalline silicon film 32, and the isolation film 2 is then formed by selectively oxidizing the polycrystalline silicon film 32 by a LOCOS process with using the silicon nitride film 23 as a mask. Thereafter, a photoresist film is formed on the silicon nitride film 23, and a second opening 23A is formed in the silicon nitride film 23 by removing the silicon nitride film 23 between adjacent isolation films with using the photoresist film as a mask. Then, the photoresist film is removed away, and a selective oxide film 35 is formed on the polycrystalline silicon film 32 by selectively oxidizing the polycrystalline silicon film 32 with using the silicon nitride film 23 as a mask. Next, a floating gate 34 having a sharp edge portion in an upper portion is formed by anisotropically etching the polycrystalline silicon film 32 with using the selective oxide film 35 as a mask, a tunnel oxide film 33 is .then formed so as to cover the floating gate 34 and the selective oxide film 35, and a control gate 36 having a region which overlaps one end portion of the floating gate 34 is formed on the tunnel oxide film 33.

PREFERRED EMBODIMENT OF THE INVENTION

Figure 1:
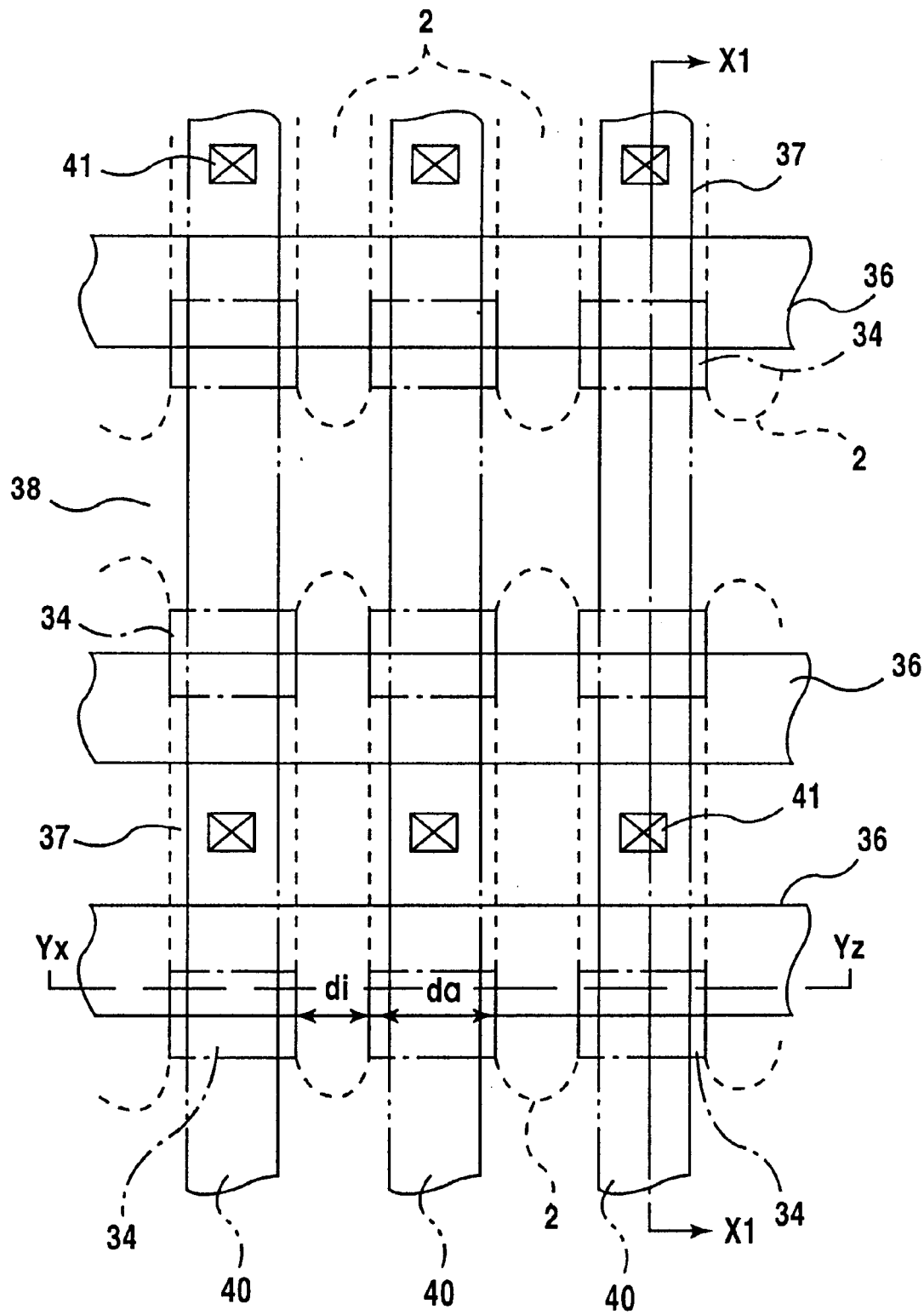
FIG. 1 is a top view showing the structure of a memory cell of a nonvolatile semiconductor memory device of a first embodiment of the invention.

Hereinafter, a nonvolatile semiconductor memory device of a first embodiment of the invention will be described with reference to the accompanying drawings. The components which are identical with those of the prior art are denoted by the same reference numerals and their description is omitted.

Figure 2A:
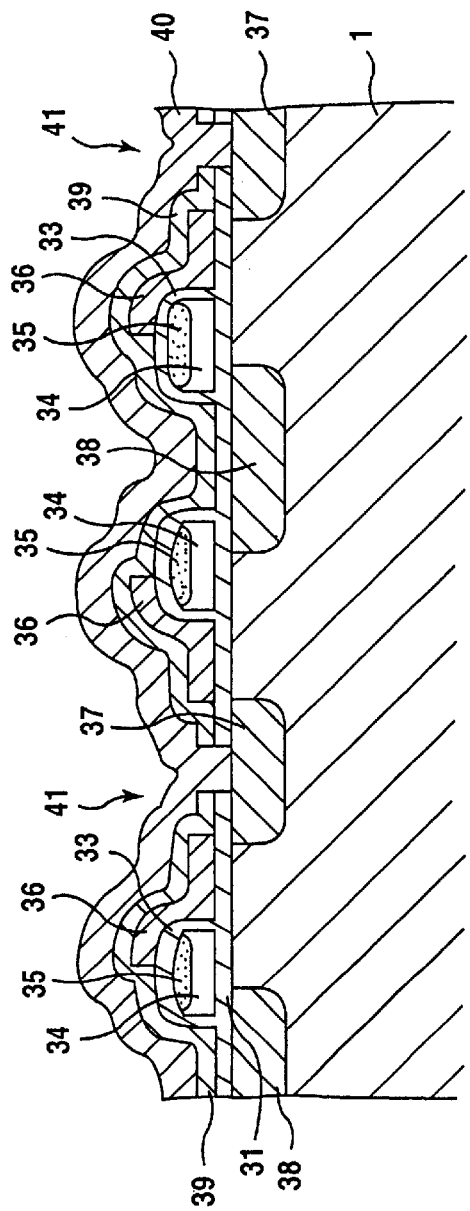
FIG. 2A is a cross sectional view taken along the line X1—X1 of FIG. 1.
Figure 2B:
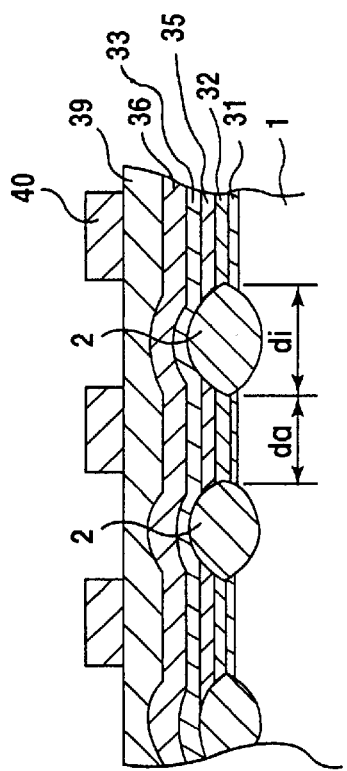
FIG. 2B is a cross sectional view taken along the line Y1—Y1 of FIG. 1.

FIG. 1 is a top view of a memory cell of a nonvolatile semiconductor memory device having a floating gate, FIG. 2A is a cross sectional view taken along the line X1—X1 of FIG. 1, and FIG. 2B is a section view taken along the line Y1—Y1 of FIG. 1. These figures show a split gate structure in which a control gate is juxtaposed with a floating gate.

In a surface region of a P-type silicon substrate 1, plural isolation films 2 consisting of a LOCOS oxide film which is formed with being selectively thickened (from 4,000 to 8,000 angstroms) by the LOCOS (Local Oxidation Of Silicon) process are formed in a strip-like manner so as to partition the surface region into device regions. The isolation films 2 are not necessary in a strip-like manner. The isolation films 2 can be formed in a continuous row manner as the aluminum interconnection 40. In such a case, it is necessary that an aluminum interconnection for contacting with the adjacent source regions 38 is formed as another layer intersecting therewith. The isolation region has a width $d_i$ of 0.5 to 1.5 microns, and the active region sandwiched between adjacent isolation regions has a width $d_a$ of 0.5 to 1.5 microns. Floating gates 34 consisting of a polycrystalline silicon film of a thickness of about 1,500 angstroms are arranged on the silicon substrate 1 via a gate oxide film 31 so as to elongate in a gap between adjacent isolation films 2. Each of the floating gates 34 is independently formed for each memory cell. A selective oxide film 35 on the floating gate 34 is formed by the selective oxidizing method so as to be thick in a center portion of the floating gate 34, and causes an edge portion of the floating gate 34 to have a sharp edge portion in an upper portion. According to this configuration, during the data erasing operation, the electric field is easily concentrated in the edge portion of the floating gate 34.

On the silicon substrate 1 where the plural floating gates 34 are arranged, control gates 36 are arranged via a tunnel oxide film 33 integrated with the oxide film 31, so as to respectively correspond to the rows of the floating gates 34. Each of the control gates 36 is disposed so that a part of the control gate overlaps the floating gate 34 and the other part is contacted with the silicon substrate 1 via the tunnel oxide film 33. The floating gates 34 and the control gates 36 are arranged so that adjacent rows are symmetrical with respect to plane.

N-type drain regions 37 and source regions 38 are formed in the silicon substrate 1 between the control gates 36 and the floating gates 34. Each drain region 37 is formed independently so as to be surrounded by the isolation films 2 between the control gates 36. Each source region 38 is continuously formed in the direction along with the control gates 36. A memory cell transistor is configured by the floating gate 34, the control gate 36, the drain region 37, and the source region 38.

An aluminum interconnection 40 is disposed on an oxide film 39 which covers the control gate 36 and floating gate 4 Via an oxide film 39 with the angle of 90 degrees to the control gate 36. The aluminum interconnection 40 is contacted with the drain region 37 via a contact hole 41. Each control gate 36 functions as a word line, the source region 38 extending in parallel with the control gate 36 functions as a source line, and the aluminum interconnection 40 connected to the drain region 37 functions as a bit line.

Hereinafter, a method of fabricating a memory cell of the nonvolatile semiconductor memory device will be described. In FIGS. 3 to 7, A is a plan view, B is a section view taken along the line A—A of A, and C is a section view taken along the line B—B of A.

Figure 3A:
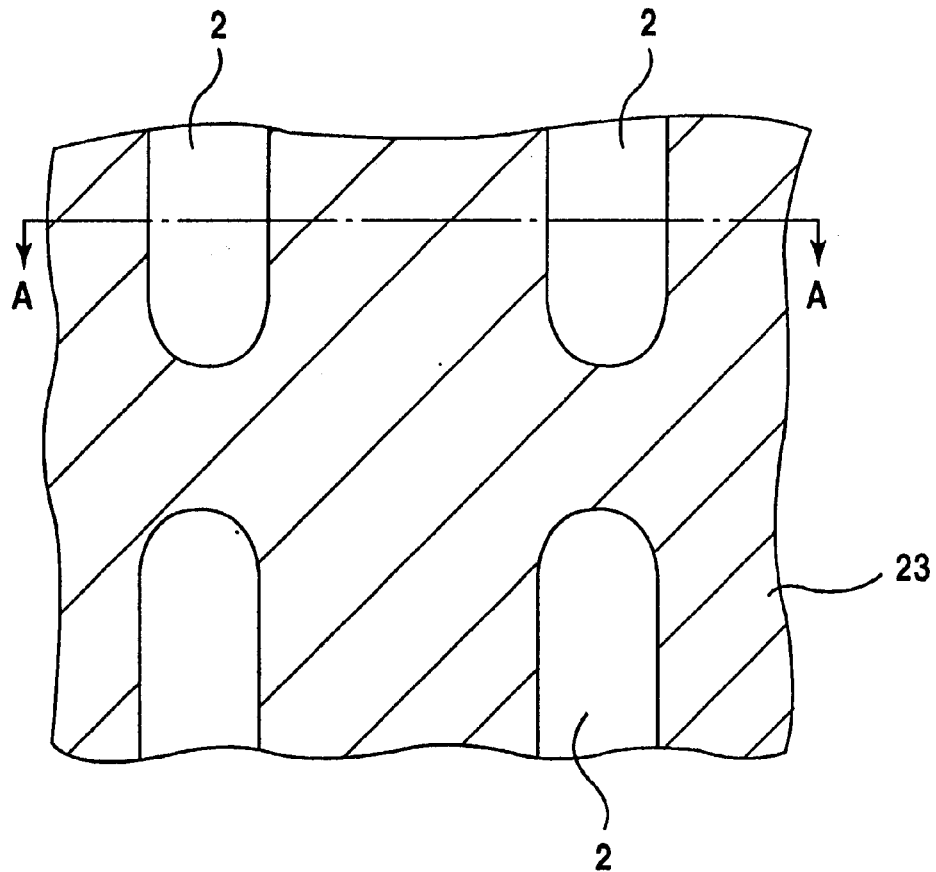
FIG. 3 is a first view showing a method of fabricating the nonvolatile semiconductor memory device of the first embodiment of the invention.
Figure 3B:
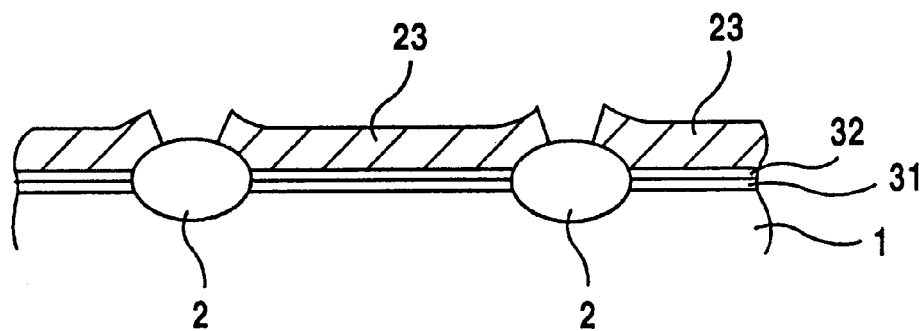

Referring to FIGS. 3A and 3B, first, the isolation film 2 is formed on the silicon substrate 1 by the LOCOS process. Namely, as shown in FIGS. 3A and 3B, the gate oxide film 31 and a polycrystalline silicon film 32 having a thickness of 1,500 angstroms are formed on the silicon substrate 1. Thereafter, selective oxidation is conducted with using a silicon nitride film 23 having an opening as a mask, thereby forming the isolation film 2. As a result of this step, the region of the polycrystalline silicon film 32 exposed from the silicon nitride film 23 is oxidized to form the isolation film 2, and the region which is below the silicon nitride film 23 and remains unoxidized serves as the floating gate 34. Therefore, the isolation film 2 and the floating gate 34 are continuously formed, and the interface is formed in a self-aligned manner.

Figure 4A:
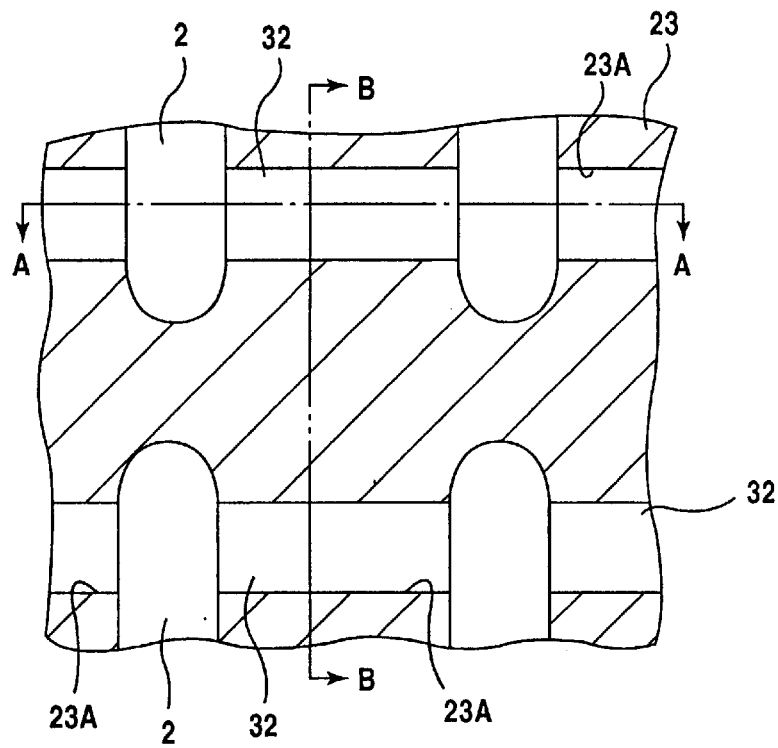
FIG. 4 is a second view showing the method of fabricating the nonvolatile semiconductor memory device of the first embodiment of the invention.
Figure 4B:
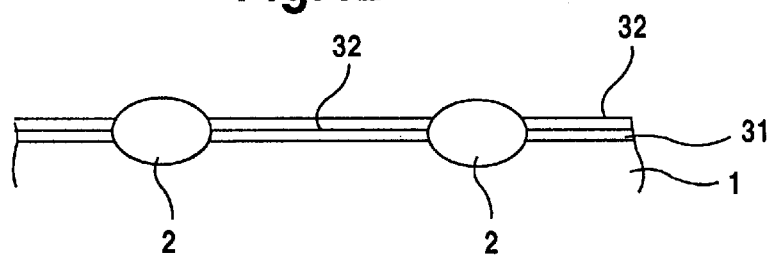
Figure 4C:
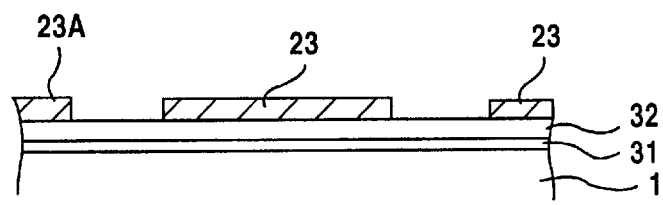

Next, as shown in FIGS. 4A to 4C, a further photoresist film which is not shown is formed on the silicon nitride film 23, and the silicon nitride film 23 in the gap between the adjacent isolation films 2 is etched to form an opening 23A with using the photoresist film as a mask. (The upper portion of the polycrystalline silicon film 32 below the opening 23A is selectively oxidized. The region which remains unoxidized below the opening 23A has a sharpened edge, and is formed into the floating gate 34 in a subsequent step.)

Figure 5A:
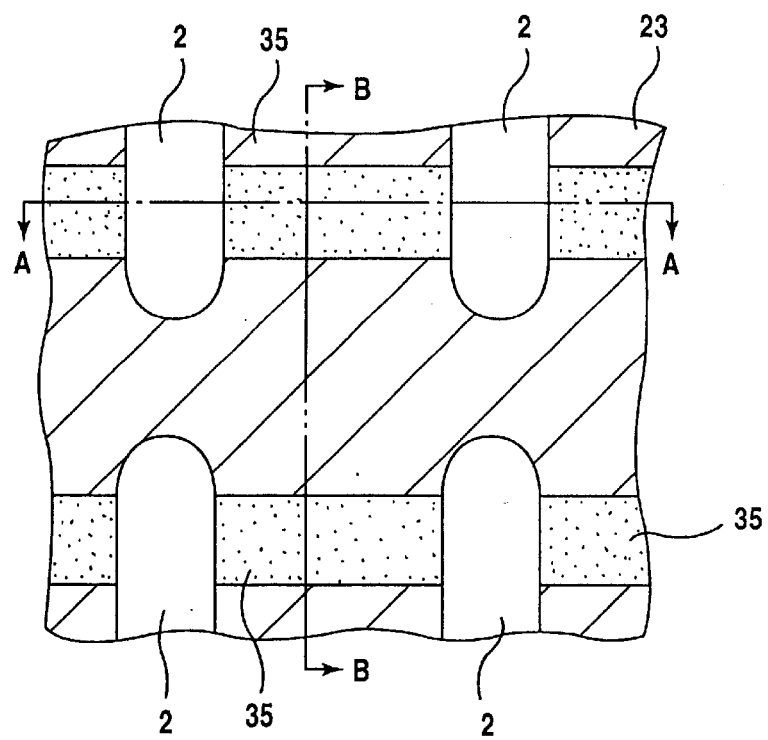
FIG. 5 is a third view showing the method of fabricating the nonvolatile semiconductor memory device of the first embodiment of the invention.
Figure 5B:
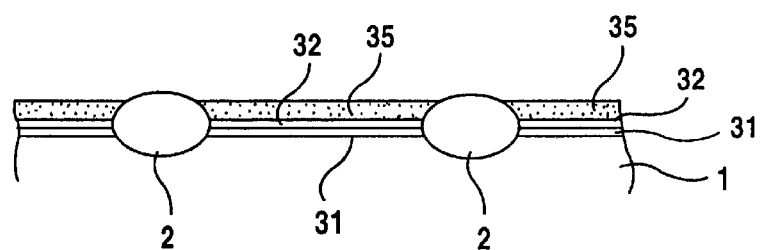
Figure 5C:
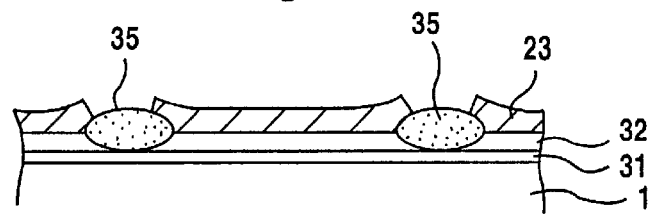

As shown in FIGS. 5A to 5C, the polycrystalline silicon film 32 below the opening 23A is selectively oxidized with using the silicon nitride film 23 as a mask, thereby forming the selective oxide film 35.

Figure 6A:
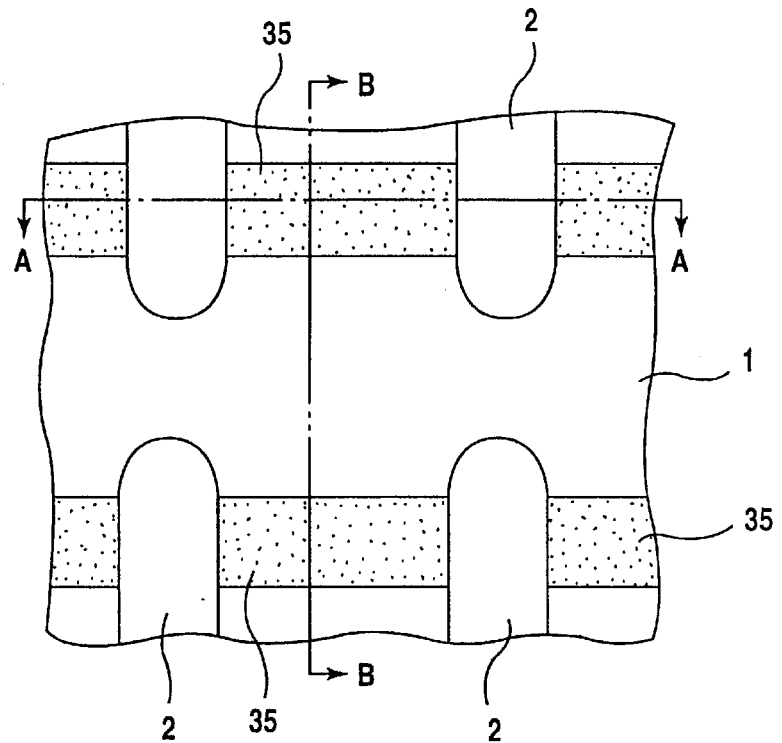
FIG. 6 is a fourth view showing the method of fabricating the nonvolatile semiconductor memory device of the first embodiment of the invention.
Figure 6B:
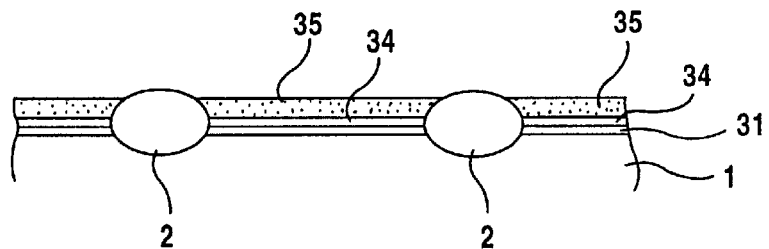
Figure 6C:
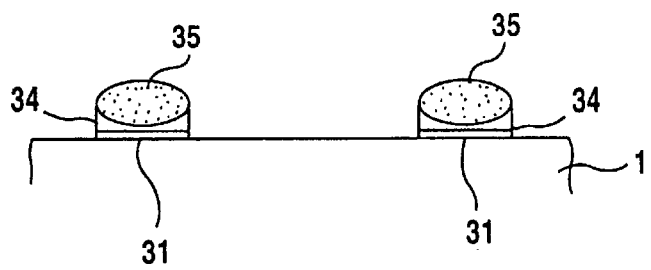

Thereafter, as shown in FIGS. 6A to 6C, the silicon nitride film 23 is removed away, and the polycrystalline silicon film 32 is then etched with using the selective oxide film 35 as a mask, thereby forming the floating gate 34 having a sharp edge in an upper portion. As a result, as shown in FIG. 6A to 6C, the floating gate 34 is disposed so as to be in a gap between the adjacent isolation film 2.

Figure 7A:
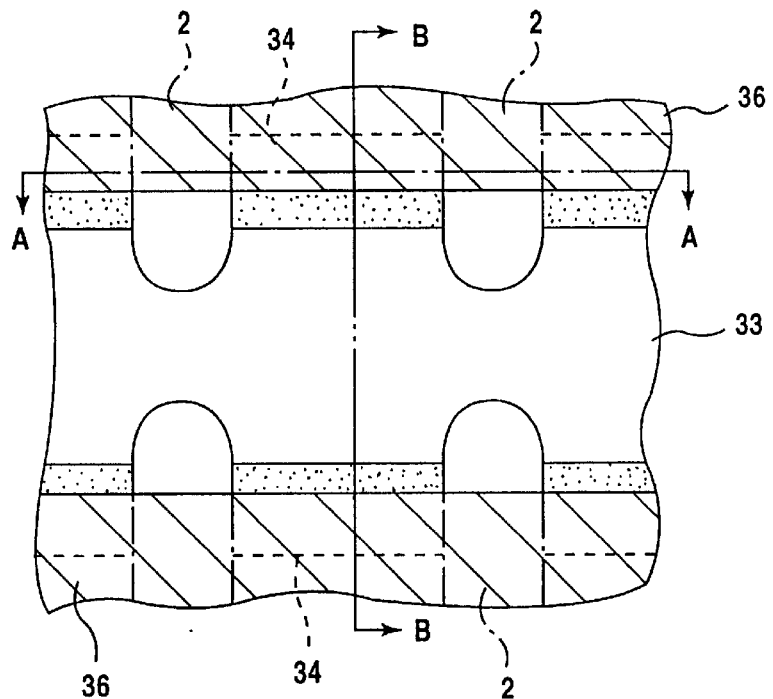
FIG. 7 is a fifth view showing the method of fabricating the nonvolatile semiconductor memory device of the first embodiment of the invention.
Figure 7B:
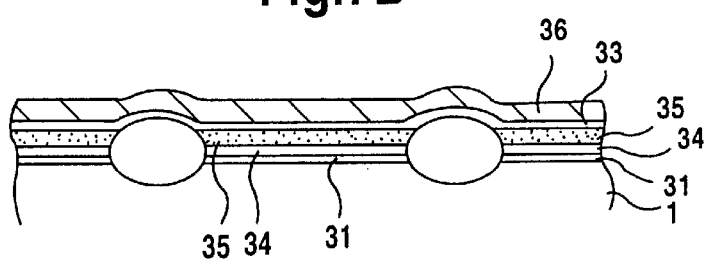
Figure 7C:
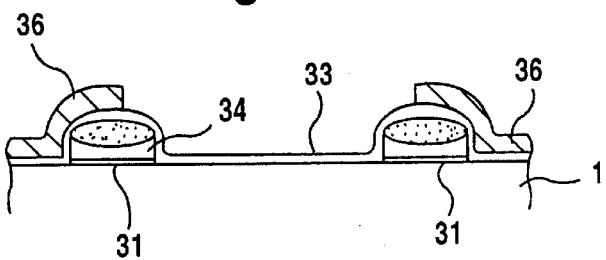

As shown in FIGS. 7A to 7C, the tunnel oxide film 33 is formed on the entire face, a conductive film consisting of a polycrystalline silicon film and a tungsten silicide film is then formed, and the conductive film is patterned to form the control gate 36. Alternatively, the control gate 36 may be a single-layer film consisting of a polycrystalline silicon film.

Although the description is omitted, as shown in FIGS. 1 and 2, the source region 38 and the drain region 37 are then formed so as to form a memory cell of the nonvolatile semiconductor memory device.

As described above, according to the invention, the polycrystalline silicon film 32 (corresponding to the pad polycrystalline silicon film 3 of the prior art) for forming the isolation film 2 is not removed away after the formation of the isolation film 2, but oxidized in the subsequent step so as to be used as a film for forming the floating gate 34. Consequently, the production steps can be simplified as compared with the prior art.

As shown in FIGS. 1 and 7C and the like, the floating gate 34 and the isolation film 2 are formed in a self-aligned manner. Unlike the prior art, therefore, a high accuracy is not required in the alignment of the floating gate 34 and the isolation film 2, and the problem in that the flow of a leak current causes the reading operation to be incorrectly conducted is solved.

Figure 18:
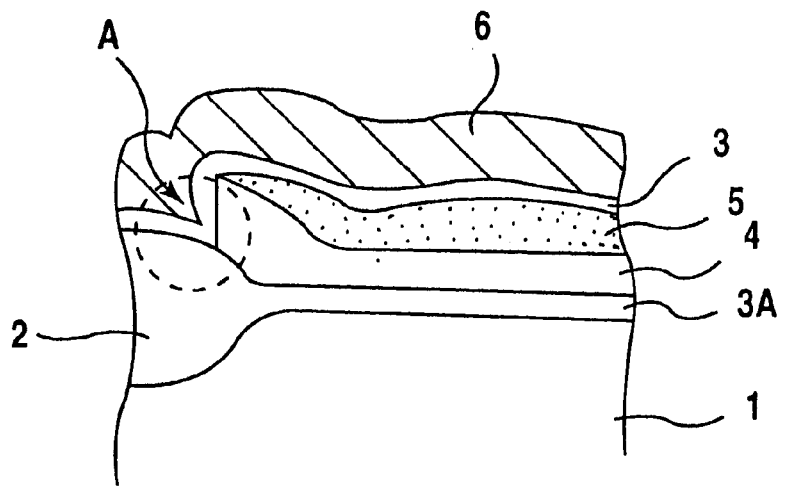
FIG. 18 is a view illustrating a problem of the prior art.
Figure 19:
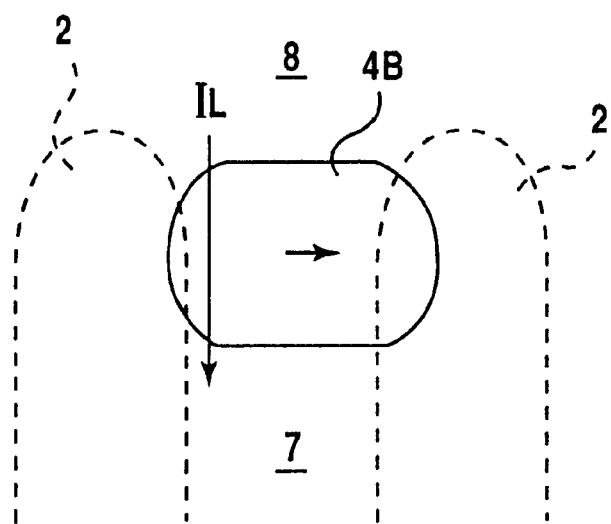
FIG. 19 is a view illustrating a problem of the prior art.

The device of the invention does not have the prior art structure (FIG. 18) in which the floating gate 4 overrides an end portion of the isolation film 2. Therefore, it is possible to solve the problem of the prior art in that the control gate 6 covering the floating gate 4 is sharpened in a horn-like manner, the electric field is concentrated in the portion, and the dielectric strength between the floating gate 4 and the control gate 6 is lowered, so that a so-called reverse tunneling failure easily occurs. Furthermore, in the structure of the device of the invention, the floating gate 34 does not override an end portion of the isolation film 2, and hence the device can be flattened.

In the embodiment of the invention, the selective oxide film 35 is formed on the polycrystalline silicon film 32, and the polycrystalline silicon film 32 is etched with using the selective oxide film 35 as a mask, to form the floating gate 34. The invention is not restricted to this. The invention may be applied to a nonvolatile semiconductor memory device having a floating gate which is configured by forming a usual polycrystalline silicon film, and then patterning the polycrystalline silicon film by a photolithography process.

Preferably, the polycrystalline silicon film has a thickness of 300 to 1,500 angstroms, and the LOCOS isolation insulating film has a thickness of about 3,000 to 8,000 angstroms, and more preferably about 5,000 to 7,000 angstroms.

Figure 8A:
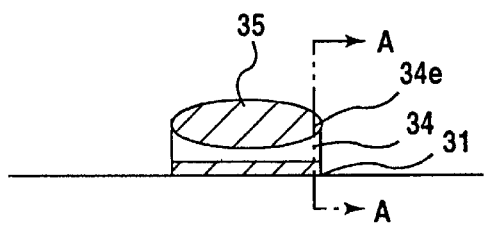
FIG. 8 is a view illustrating main portions of the invention.
Figure 8B:
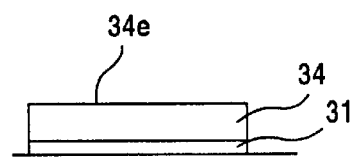

In the embodiment, as shown in enlarged views of FIGS. 8A and 8B (FIG. 8B is a section view as seen in the direction of A—A of FIG. 8A), an edge of the floating gate 34 is formed so as to have a sharp knife-shaped edge. In the embodiment, during the data erasing operation, the electric field is easily concentrated over the whole of the edge 34e of the floating gate, so that the time period required for the data erasure can be shortened.

Figure 9A:
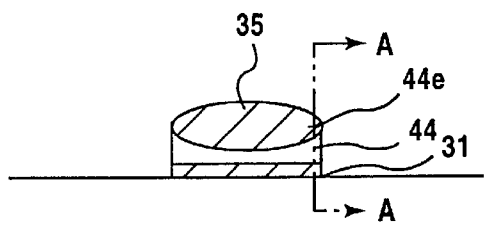
FIG. 9 is a view illustrating a modification of the invention.
Figure 9B:
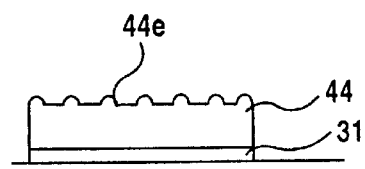
Figure 10:
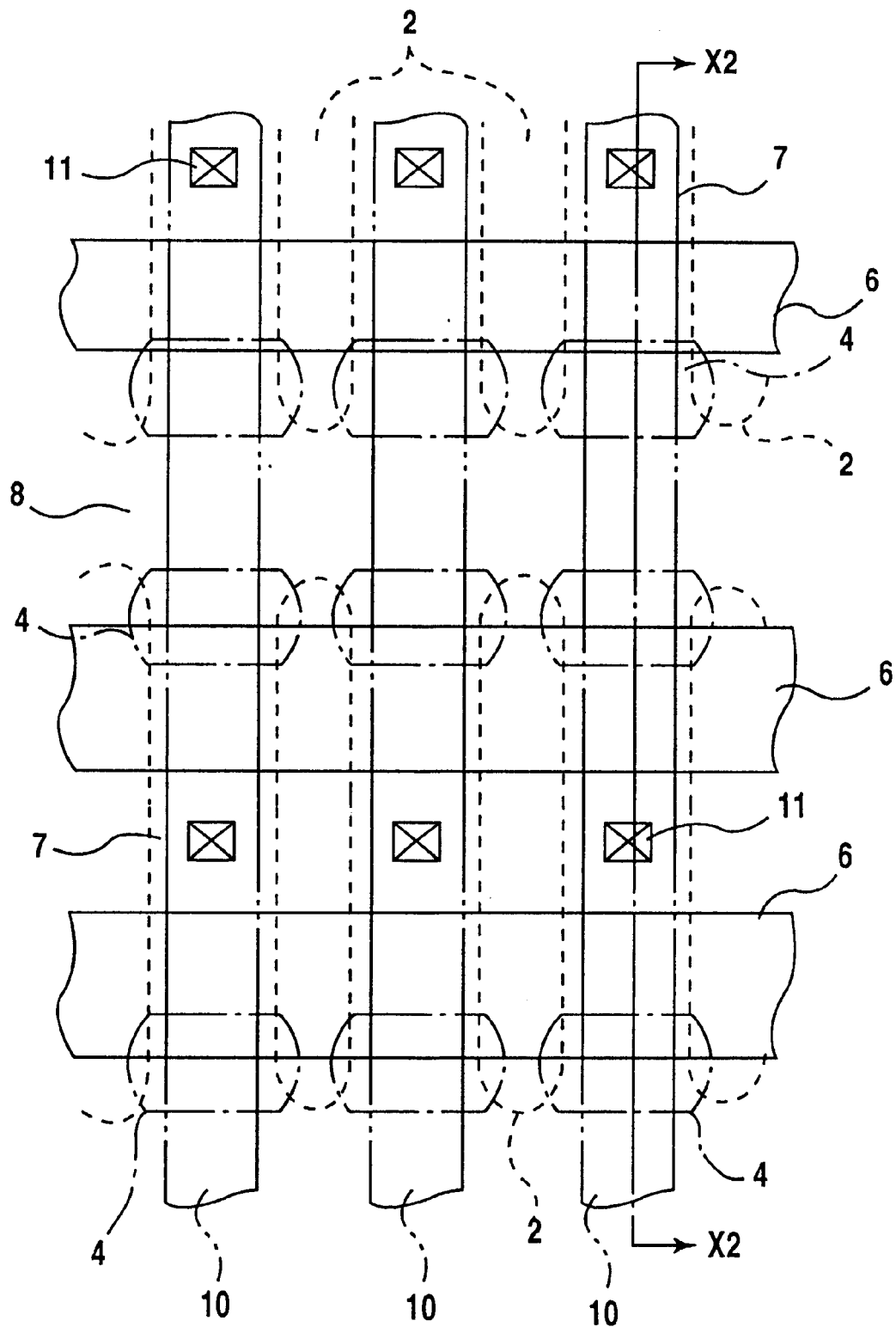
FIG. 10 is a top plan view showing the structure of a memory cell of a nonvolatile semiconductor memory device of the prior art.
Figure 11:
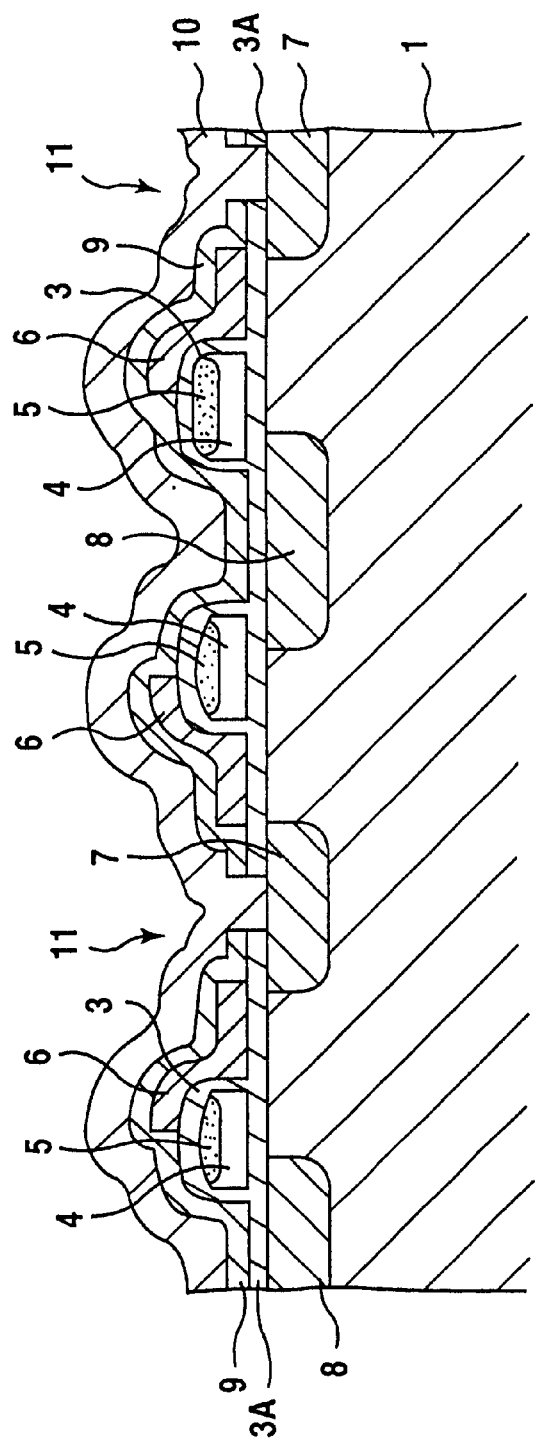
FIG. 11 is a cross sectional view taken along the line X2—X2 of FIG. 10.
Figure 12A:
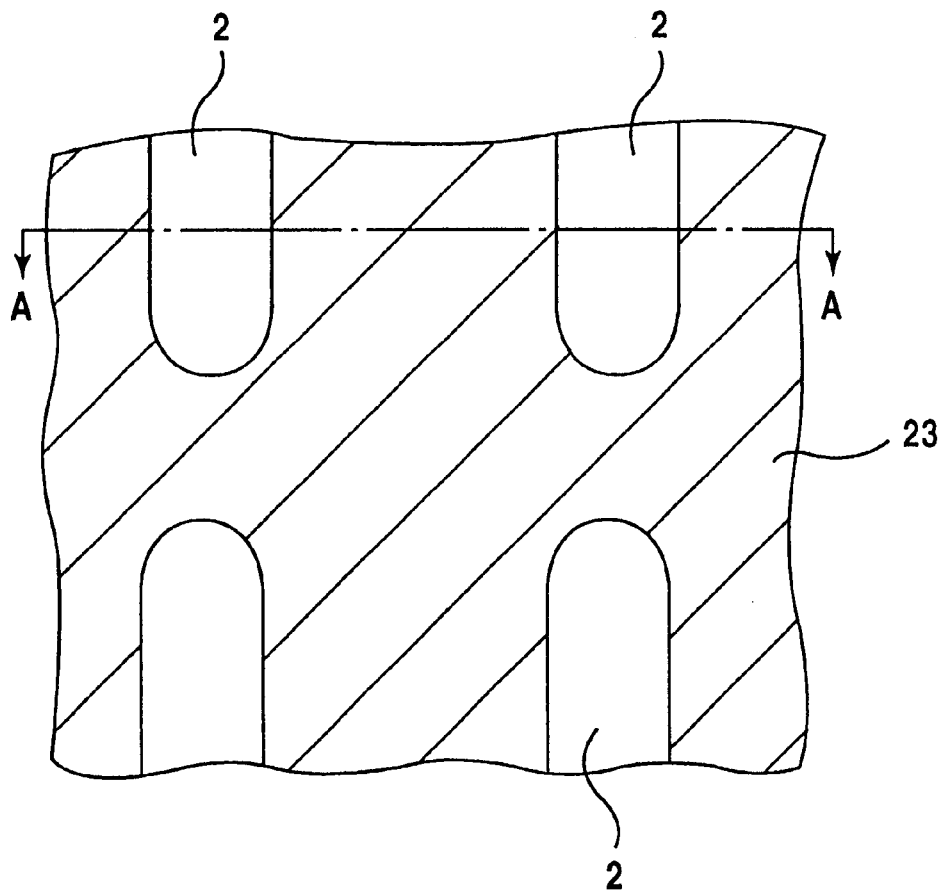
FIG. 12 is a first view showing a method of fabricating the nonvolatile semiconductor memory device of the prior art.
Figure 12B:
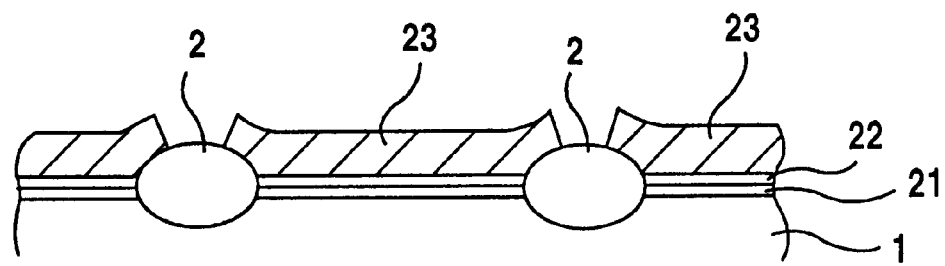
Figure 13A:
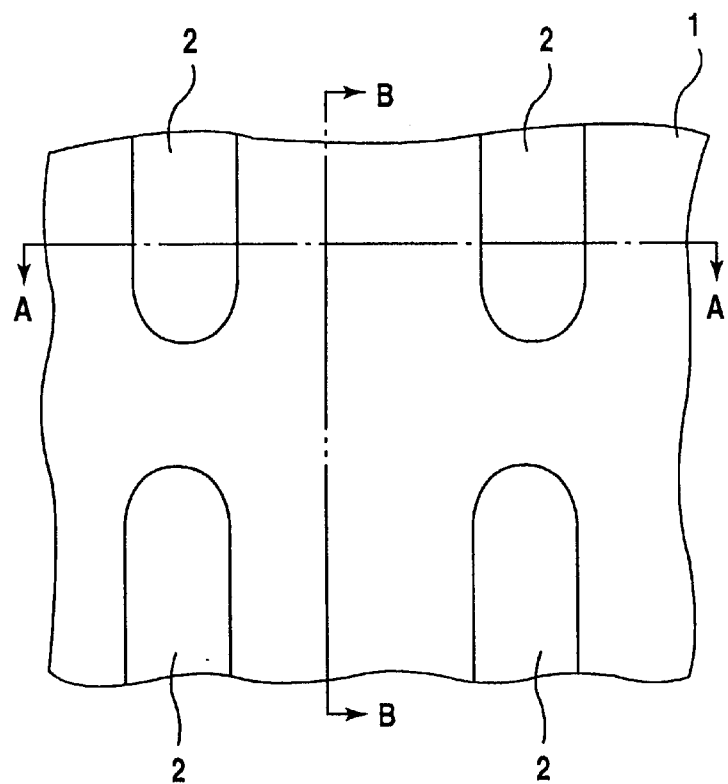
FIG. 13 is a second view showing the method of fabricating the nonvolatile semiconductor memory device of the prior art.
Figure 13B:
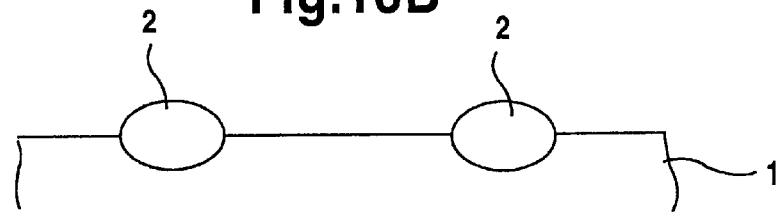
Figure 13C:
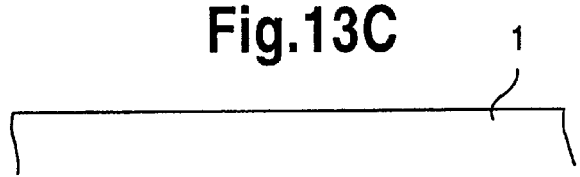
Figure 14A:
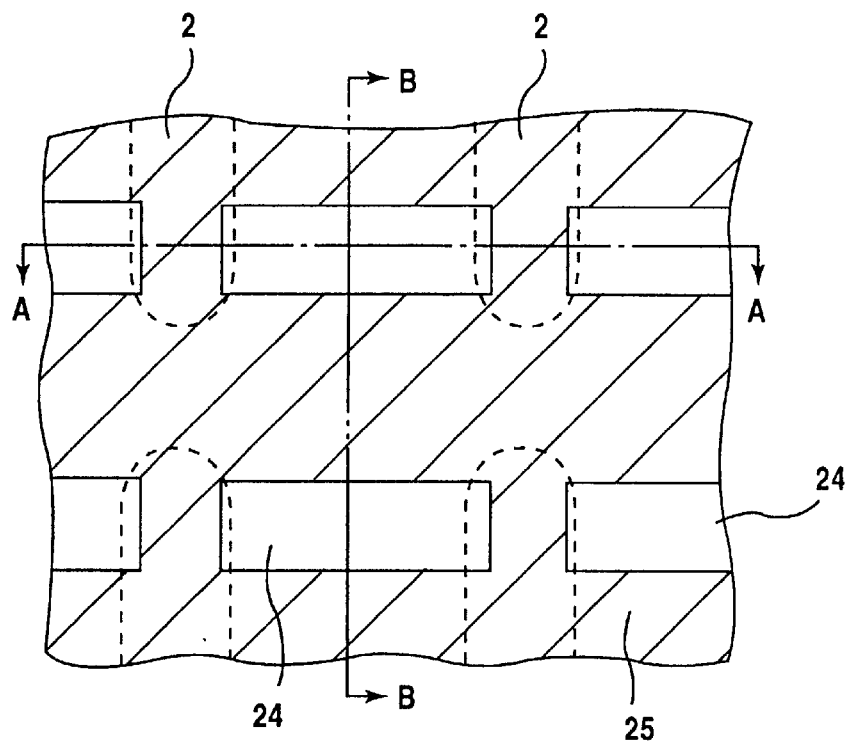
FIG. 14 is a third view showing the method of fabricating the nonvolatile semiconductor memory device of the prior art.
Figure 14B:
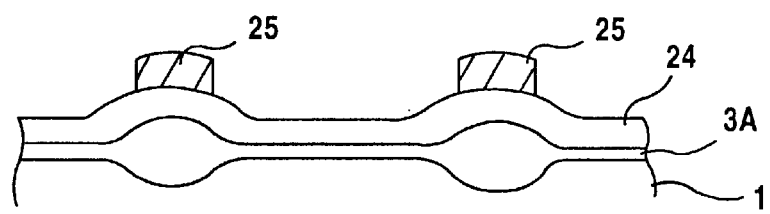
Figure 14C:
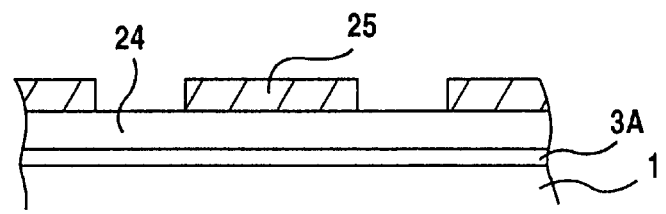
Figure 15A:
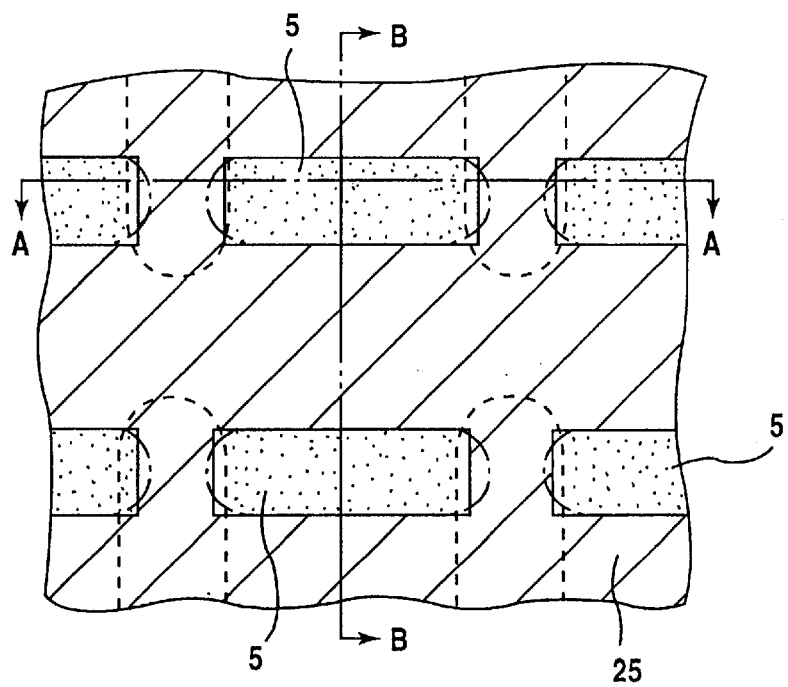
FIG. 15 is a fourth view showing the method of fabricating the nonvolatile semiconductor memory device of the prior art.
Figure 15B:
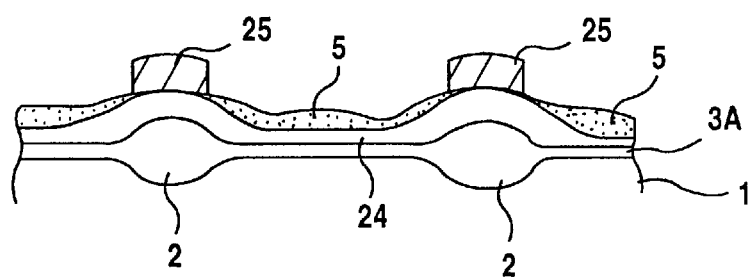
Figure 15C:
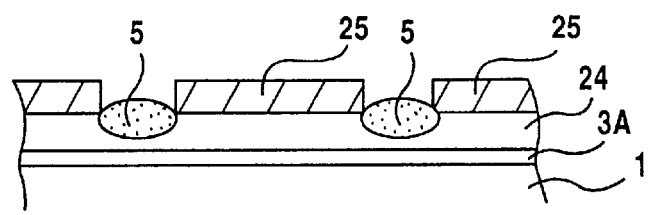
Figure 16A:
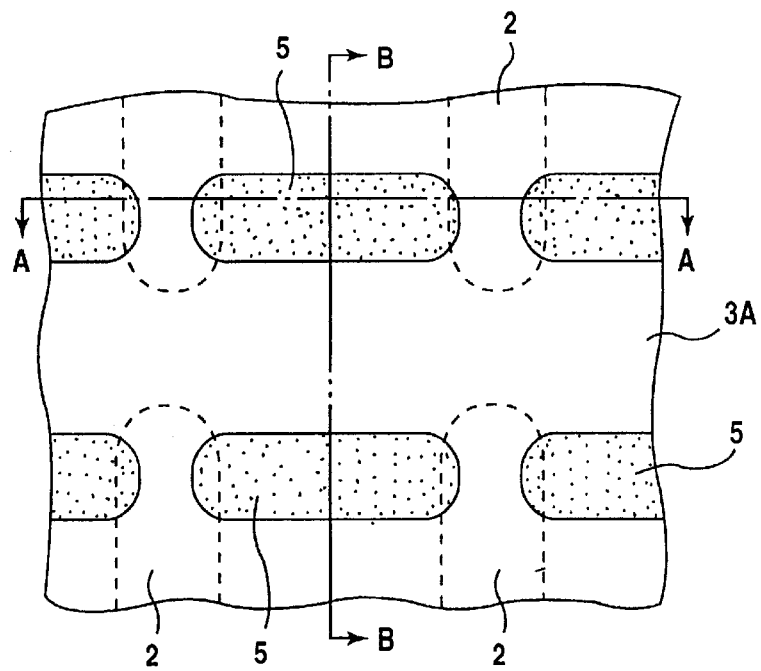
FIG. 16 is a fifth view showing the method of fabricating the nonvolatile semiconductor memory device of the prior art.
Figure 16B:
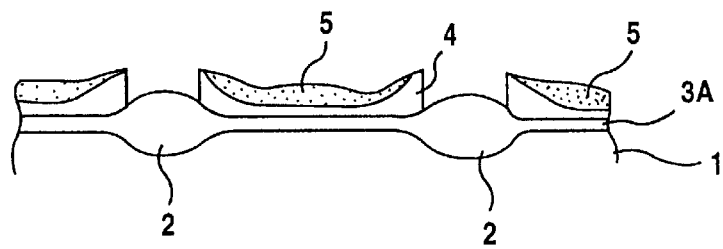
Figure 16C:
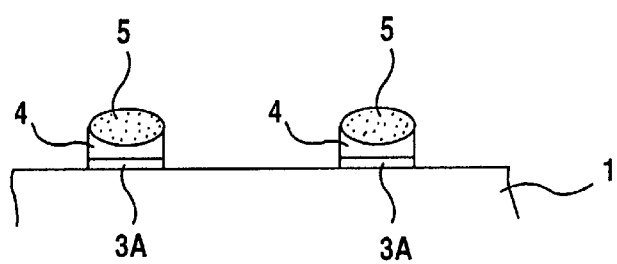
Figure 17A:
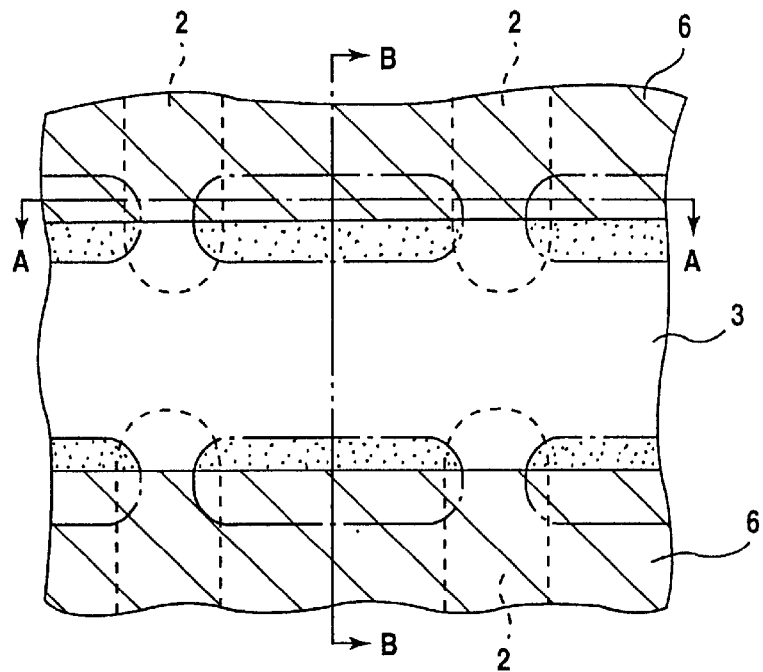
FIG. 17 is a sixth view showing the method of fabricating the nonvolatile semiconductor memory device of the prior art.
Figure 17B:
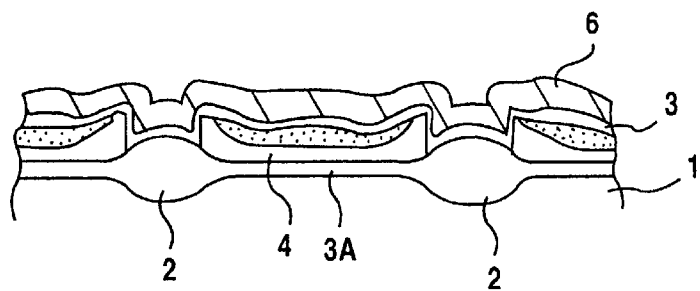
Figure 17C:
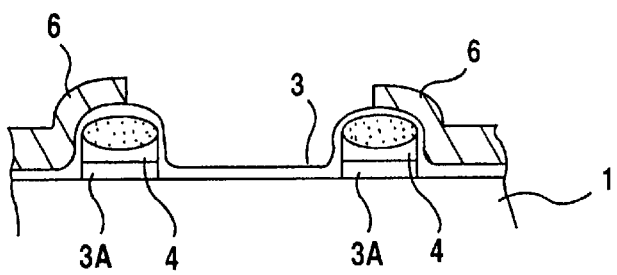

In the embodiment, the floating gate is configured by polycrystalline silicon. Depending on conditions of the film growth of polycrystalline silicon, the surface may be roughened, and the region which remains after the selective oxidation may have an uneven edge as shown in FIG. 9 (FIG. 9B is a section view as seen in the direction of A—A of FIG. 9A). In other words, an edge 44e of the floating gate is intermittently formed in a spot-like shape. In this case, during the data erasing operation, concentration of the electric field is efficiently produced, and in microscopic observation a current efficiently flows from plural places to the control gate, with the result that the time period required for the data erasure can be further shortened.

In the embodiment, the floating gate is configured by polycrystalline silicon. Alternatively, the floating gate may be configured by amorphous silicon, single crystal silicon, or the like.

According to the invention, the polycrystalline silicon film for forming the isolation film is not removed away after the formation of the isolation film, but, after a subsequent step, used as a film for forming the floating gate. Consequently, the production steps can be simplified as compared with the prior art.

Furthermore, the floating gate and the isolation film are formed in a self-aligned manner. Unlike the prior art, therefore, a high accuracy is not required in the alignment of the floating gate to the isolation film, and the problem in that the flow of a leak current causes the reading operation to be incorrectly conducted can be solved.

The device of the invention does not have the prior art structure in which a floating gate overrides an end portion of a isolation film. Therefore, it is possible to solve also the problem of the prior art in that the control gate covering the floating gate is sharpened in a horn-like manner, the electric field is concentrated in the portion, and the dielectric strength between the floating gate and the control gate is therefore lowered, so that a so-called reverse tunneling failure easily occurs. Furthermore, in the structure of the device of the invention, the floating gate does not override an end portion of the isolation film, and hence the device can be flattened.

What is claimed is:

1. A nonvolatile semiconductor memory device comprising:

an element isolation film formed on a semiconductor substrate of one conductivity type;

a floating gate which is formed in an active region isolated by said element isolation film so as to be disposed in a gap between adjacent element isolation films and make each of end portions coincident with each end of said adjacent element isolation films in a self-aligned manner;

a tunnel oxide film which covers said floating gate;

a control gate formed on said tunnel oxide film comprising a region which overlaps said floating gate; and a diffusion region of an opposite conductivity type and formed in a surface of said semiconductor substrate adjacent to said floating gate and said control gate.

2. The nonvolatile semiconductor memory device according to claim 1, wherein said floating gate comprises a sharp edge portion at an upper end.

3. The nonvolatile semiconductor memory device according to claim 1, wherein said floating gate has a sharp edge portion over the whole of an upper end.

4. The nonvolatile semiconductor memory device according to claim 1, wherein said floating gate has an upper end which has a plurality of sharp protrusions.

5. The nonvolatile semiconductor memory device according to claim 1, wherein said element isolation film comprises a first portion which is formed by selective oxidation of the surface of said semiconductor substrate and extending from the surface of said semiconductor substrate to a predetermined depth, and a second portion which is formed by selective oxidation of at least one layer of said floating gate.

6. The nonvolatile semiconductor memory device according to claim 1, wherein said element isolation film comprises a silicon oxide film which is formed by selective oxidation of a polycrystalline silicon film constituting said floating gate.

7. The nonvolatile semiconductor memory device according to claim 1, wherein said element isolation film is a silicon oxide film formed by selective oxidation of a single crystal silicon film constituting said floating gate.

8. The nonvolatile semiconductor memory device according to claim 1, wherein said element isolation film is an oxide film formed by selective oxidation of an amorphous silicon film constituting said floating gate.

9. The nonvolatile semiconductor memory device according to claim 5, wherein said floating gate is a two-layer film consisting of a polycrystalline silicon film and a refractory metal film, and said second portion is a silicon oxide film formed by selective oxidation of said polycrystalline silicon film.

* * * * *